United States Patent
Lee et al.

(10) Patent No.: US 9,837,212 B2
(45) Date of Patent: Dec. 5, 2017

(54) MULTILAYER CERAMIC CAPACITOR, METHOD OF MANUFACTURING THE SAME, AND BOARD HAVING THE SAME MOUNTED THEREON

(71) Applicant: SAMSUNG ELECTRO-MECHANICS CO., LTD., Suwon, Gyunggi-do (KR)

(72) Inventors: Seung Ho Lee, Gyunggi-do (KR); Jong Han Kim, Gyunggi-do (KR); Min Gon Lee, Gyunggi-do (KR); Yoon Hee Lee, Gyunggi-do (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 797 days.

(21) Appl. No.: 14/067,835

(22) Filed: Oct. 30, 2013

(65) Prior Publication Data

US 2015/0027764 A1 Jan. 29, 2015

(30) Foreign Application Priority Data

Jul. 29, 2013 (KR) .................. 10-2013-0089618

(51) Int. Cl.
*H01G 4/30* (2006.01)
*H01G 4/012* (2006.01)
(Continued)

(52) U.S. Cl.
CPC .............. *H01G 4/30* (2013.01); *H01G 4/012* (2013.01); *H01G 4/12* (2013.01); *H01G 4/0085* (2013.01);
(Continued)

(58) Field of Classification Search
CPC ............ H01G 4/30; H01G 4/005; H01G 4/12; H01G 4/1227; H01G 4/248; H01G 4/012
(Continued)

(56) References Cited

U.S. PATENT DOCUMENTS

| | | | |
|---|---|---|---|
| 5,632,841 | A | 5/1997 | Hellbaum |
| 7,203,055 | B2 | 4/2007 | Shin |

(Continued)

FOREIGN PATENT DOCUMENTS

| | | | |
|---|---|---|---|
| JP | 2002-164248 A | 6/2002 | |
| JP | 2004-311985 A | 11/2004 | |

(Continued)

OTHER PUBLICATIONS

Japanese Notice of Office Action issued in counterpart Japanese Patent Application No. 2013-225406 dated Dec. 9, 2014; 7 pages with English translation.

(Continued)

*Primary Examiner* — Nguyen Ha
(74) *Attorney, Agent, or Firm* — McDermott Will & Emery LLP

(57) ABSTRACT

There is provided a multilayer ceramic capacitor including: a ceramic body including dielectric layers; and a plurality of internal electrodes disposed within the ceramic body, having the dielectric layer interposed therebetween, wherein, on a cross section of the ceramic body in a width-thickness direction thereof, when a distance between an uppermost internal electrode and a lowermost internal electrode measured at centers thereof in a width direction thereof is defined as a and a distance between the uppermost internal electrode and the lowermost internal electrode measured at edges thereof in the width direction thereof is defined as b, $0.953 \leq a/b \leq 0.996$ is satisfied.

17 Claims, 6 Drawing Sheets

(51) Int. Cl.
*H01G 4/12* (2006.01)
*H05K 3/34* (2006.01)
*H01G 4/008* (2006.01)

(52) U.S. Cl.
CPC ......... *H01G 4/1227* (2013.01); *H05K 3/3442* (2013.01); *H05K 2201/10015* (2013.01); *H05K 2201/10636* (2013.01); *Y02P 70/611* (2015.11); *Y10T 29/435* (2015.01)

(58) Field of Classification Search
USPC .... 361/301.2, 301.4, 303–305, 306.1, 306.2, 361/321.1, 321.2
See application file for complete search history.

(56) References Cited

U.S. PATENT DOCUMENTS

| | | | | |
|---|---|---|---|---|
| 8,422,196 | B2* | 4/2013 | Kim | H01G 4/30 361/303 |
| 8,737,037 | B2* | 5/2014 | Kim | H01G 4/30 361/305 |
| 9,036,328 | B2* | 5/2015 | Kim | H01G 4/30 361/301.4 |
| 9,230,738 | B2* | 1/2016 | Kim | H01G 4/12 |
| 9,484,153 | B2* | 11/2016 | Kim | H01G 4/30 |
| 2012/0152604 | A1* | 6/2012 | Ahn | H01G 2/065 174/260 |
| 2012/0306325 | A1* | 12/2012 | Kim | H01G 4/30 310/366 |
| 2013/0027842 | A1 | 1/2013 | Kim et al. | |
| 2013/0049532 | A1 | 2/2013 | Kim et al. | |
| 2013/0242460 | A1* | 9/2013 | Lee | H01G 4/30 361/303 |
| 2013/0329338 | A1* | 12/2013 | Hiramatsu | H01G 4/005 361/305 |

FOREIGN PATENT DOCUMENTS

| | | |
|---|---|---|
| JP | 2009-164446 A | 7/2009 |
| JP | 2013-30753 A | 2/2013 |
| JP | 2013-55314 | 2/2013 |
| KR | 10-2012-0133697 A | 12/2012 |
| WO | 2012/093575 A1 | 7/2012 |

OTHER PUBLICATIONS

Notice of Office Action dated Jul. 30, 2014 issued in Korean Patent Application No. 10-2013-0089618 (English translation).

D. Liu and M. Sampson, "Reliability Evaluation of Base-Metal-Electrode Multilayer Ceramic Capacitors for Potential Space Applications," published CARTS proceedings, pp. 45-63, 2011 (from Capacitors and Resistors Technology Symposium (CARTS) Conference, Jacksonville, FL, Mar. 28-31, 2011).

* cited by examiner

MULTILAYER CERAMIC CAPACITOR, METHOD OF MANUFACTURING THE SAME, AND BOARD HAVING THE SAME MOUNTED THEREON

CROSS-REFERENCE TO RELATED APPLICATION

This application claims the benefit of Korean Patent Application No. 10-2013-0089618 filed on Jul. 29, 2013, with the Korean Intellectual Property Office, the disclosure of which is incorporated herein by reference.

BACKGROUND OF THE INVENTION

Field of the Invention

The present invention relates to a multilayer ceramic capacitor, a method of manufacturing the same, and a board having the same mounted thereon.

Description of the Related Art

Generally, electronic components using a ceramic material, such as a capacitor, an inductor, a piezoelectric element, a varistor, or a thermistor, or the like, include a ceramic body formed of a ceramic material, internal electrodes formed in the ceramic body, and external electrodes formed on surfaces of the ceramic body so as to be connected to the internal electrodes.

Among ceramic electronic components, a multilayer ceramic capacitor includes a plurality of dielectric layers stacked therein, internal electrodes disposed to face each other, having the dielectric layer interposed therebetween, and external electrodes electrically connected to the internal electrodes.

The multilayer ceramic capacitor has been widely used in mobile communications devices such as a computer, a personal digital assistant (PDA), a cellular phone, or the like, due to advantages such as a small size, high capacitance, ease of mounting, and the like.

Recently, in accordance with the trend toward high performance, slimness and lightness in products produced by the electrical appliances and electronic device industries, relatively small, high performance, and inexpensive electronic components have been required. Particularly, as speeds of central processing units (CPU) have increased and devices have been miniaturized, lightened, digitalized, and have had high degrees of functionality implemented therein, research into technology allowing for miniaturization, thinness, high capacitance, low impedance in a high frequency area, or the like, to be implemented in multilayer ceramic capacitors, has been actively conducted.

RELATED ART DOCUMENT (Patent Document 1) Japanese Patent Laid-Open Publication No. 2002-164248

SUMMARY OF THE INVENTION

An aspect of the present invention provides a multilayer ceramic capacitor having high capacitance and superior reliability, a method of manufacturing the same, and a board having the same mounted thereon.

According to an aspect of the present invention, there is provided a multilayer ceramic capacitor including: a ceramic body including dielectric layers; and a plurality of internal electrodes disposed within the ceramic body, having the dielectric layer interposed therebetween, wherein, on a cross section of the ceramic body in a width-thickness direction thereof, when a distance between an uppermost internal electrode and a lowermost internal electrode measured at centers thereof in a width direction thereof is defined as a and a distance between the uppermost internal electrode and the lowermost internal electrode measured at edges thereof in the width direction thereof is defined as b, $0.953 \leq a/b \leq 0.996$ is satisfied.

Edge portions of the ceramic body in a width direction thereof may be thicker than a central portion thereof in the width direction.

The internal electrodes may include non-electrode portions.

The internal electrodes may include at least one selected from a group consisting of nickel (Ni), manganese (Mn), chrome (Cr), copper (Cu), palladium (Pd), silver (Ag), cobalt (Co), and aluminum (Al).

The non-electrode portions may include a ceramic material.

The non-electrode portions may include at least one of barium titanate and a barium titanate oxide.

The internal electrodes may have a thickness of 0.1 μm to 0.5 μm.

According to another aspect of the present invention, there is provided a method of manufacturing a multilayer ceramic capacitor, the method including: preparing a plurality of ceramic green sheets; producing a conductive paste for internal electrodes including a conductive powder and a ceramic additive; forming internal electrode patterns on the ceramic green sheets using the conductive paste for internal electrodes; stacking the ceramic green sheets having the internal electrode patterns formed thereon to form a multilayer body; cutting the multilayer body while allowing one ends of the internal electrode patterns to be alternately exposed, to form a multilayer chip; sintering the multilayer chip to form a ceramic body including internal electrodes; and forming external electrodes so as to be electrically connected to the internal electrodes, wherein, on a cross section of the ceramic body in a width-thickness direction thereof, when a distance between an uppermost internal electrode and a lowermost internal electrode measured at centers thereof in a width direction thereof is defined as a and a distance between the uppermost internal electrode and the lowermost internal electrode measured at edges thereof in the width direction thereof is defined as b, $0.953 \leq a/b \leq 0.996$ is satisfied.

The multilayer chip may be sintered while maintaining the multilayer chip for a predetermined time in two or more temperature sections.

A content of the ceramic additive may be 3 to 14 parts by weight based on 100 parts by weight of the conductive powder.

When an average particle size of the conductive powder is defined as d1 and an average particle size of the ceramic additive is defined as d2, $0.03 \leq d2/d1 \leq 0.05$ may be satisfied.

A content of the ceramic additive may be 6 to 12 parts by weight based on 100 parts by weight of the conductive powder.

When an average particle size of the conductive powder is defined as d1 and an average particle size of the ceramic additive is defined as d2, $0.05 \leq d2/d1 \leq 0.1$ may be satisfied.

The conductive powder may include at least one selected from a group consisting of nickel (Ni), manganese (Mn), chrome (Cr), copper (Cu), palladium (Pd), silver (Ag), cobalt (Co), and aluminum (Al).

The ceramic additive may include at least one of barium titanate and a barium titanate oxide.

Edge portions of the ceramic body in a width direction thereof may be thicker than a central portion thereof in the width direction.

According to another aspect of the present invention, there is provided a board having a multilayer ceramic capacitor mounted thereon, the board including: a printed circuit board having first and second electrode pads disposed thereon; and a multilayer ceramic capacitor mounted on the printed circuit board, wherein the multilayer ceramic capacitor includes a ceramic body including dielectric layers, and a plurality of internal electrodes disposed within the ceramic body, having the dielectric layer interposed therebetween, and on a cross section of the ceramic body in a width-thickness direction thereof, when a distance between an uppermost internal electrode and a lowermost internal electrode measured at centers thereof in a width direction thereof is defined as a and a distance between the uppermost internal electrode and the lowermost internal electrode measured at edges thereof in the width direction thereof is defined as b, $0.953 \leq a/b \leq 0.996$ is satisfied.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
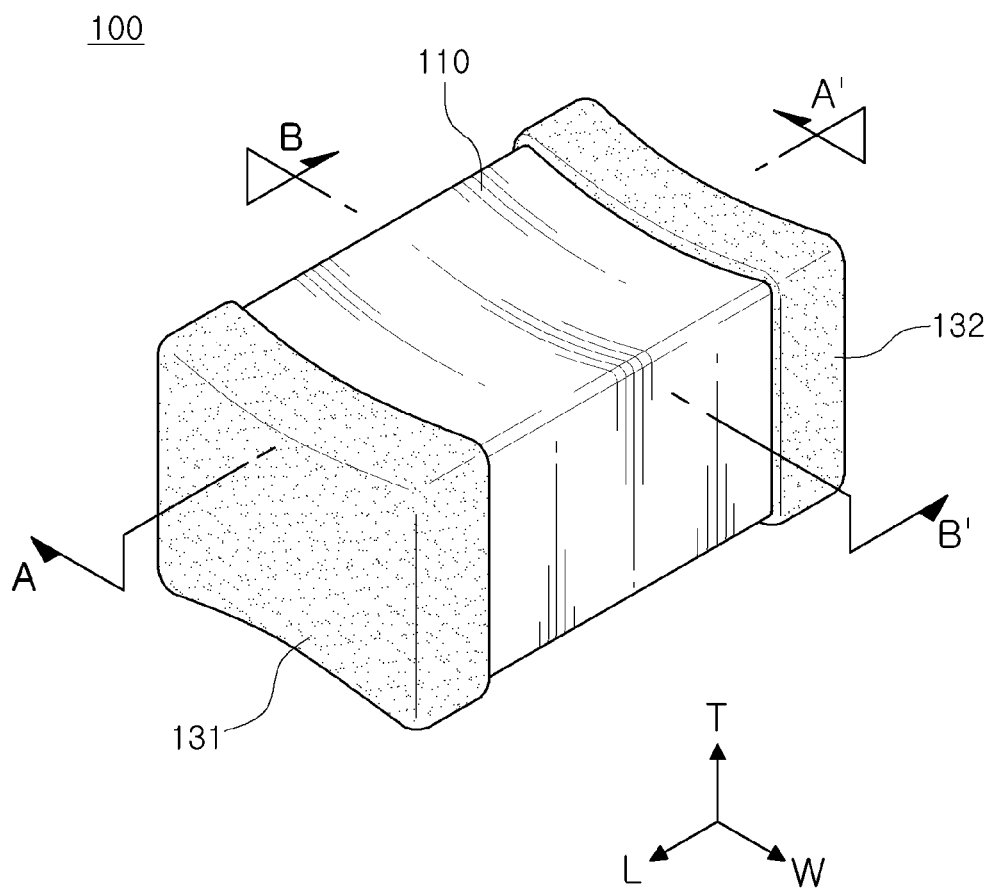
FIG. 1 is a schematic perspective view of a multilayer ceramic capacitor according to an embodiment of the present invention.

Hereinafter, embodiments of the present invention will be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like elements.

Multilayer Ceramic Capacitor

FIG. 1 is a schematic perspective view of a multilayer ceramic capacitor according to an embodiment of the present invention.

Figure 2A:
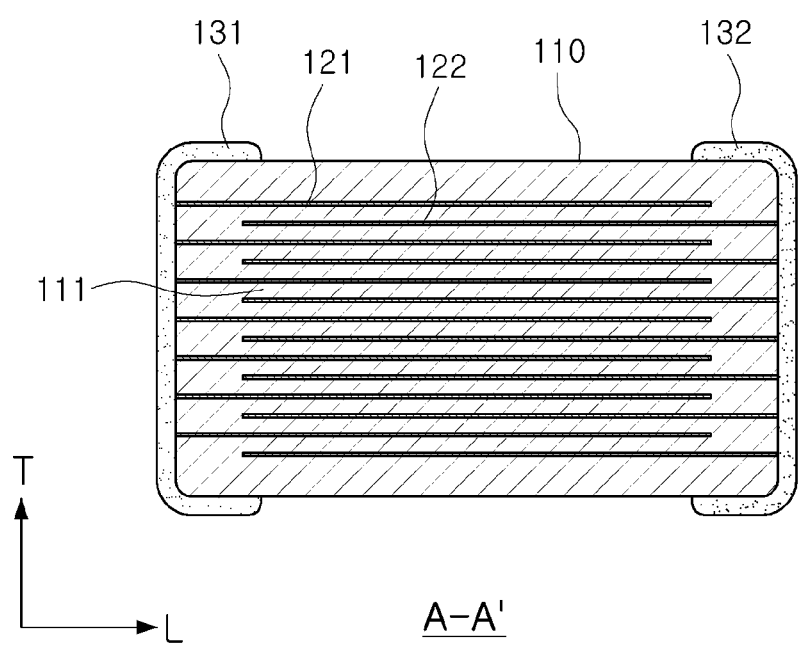
FIG. 2A is a schematic cross-sectional view of the multilayer ceramic capacitor taken along line A-A' of FIG. 1.

FIG. 2A is a schematic cross-sectional view of the multilayer ceramic capacitor taken along line A-A' of FIG. 1.

Figure 2B:
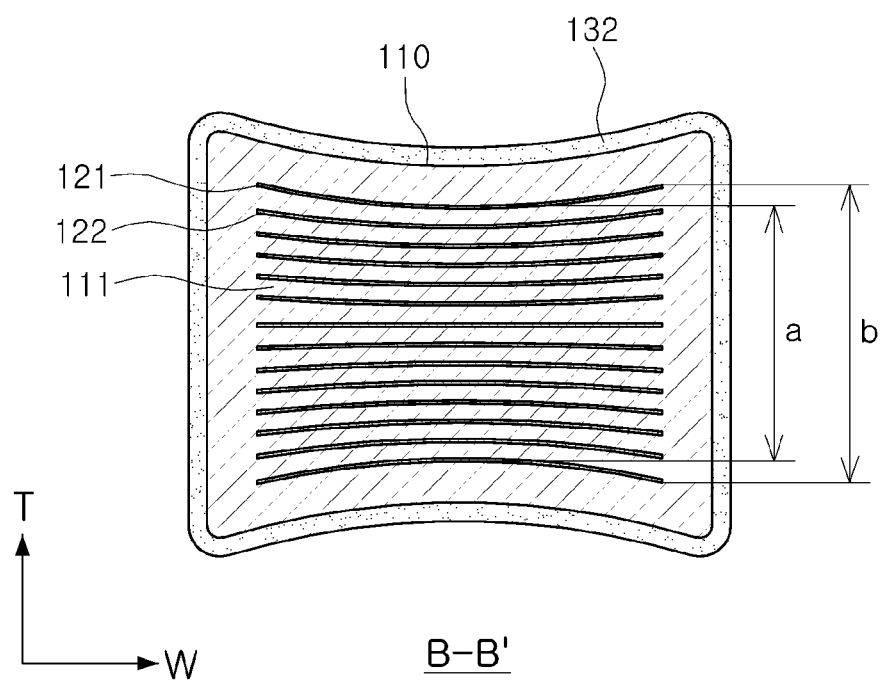
FIG. 2B is a schematic cross-sectional view of the multilayer ceramic capacitor taken along line B-B' of FIG. 1.

FIG. 2B is a schematic cross-sectional view of the multilayer ceramic capacitor taken along line B-B' of FIG. 1.

Referring to FIGS. 1 through 2B, a multilayer ceramic capacitor according to the present embodiment may include a ceramic body 110 including dielectric layers 111, first and second internal electrodes 121 and 122 formed in the ceramic body 110 and disposed to face each other, having the dielectric layer 111 interposed therebetween, and first and second external electrodes 131 and 132 formed on outer surfaces of the ceramic body 110.

In the multilayer ceramic capacitor according to the embodiment of the invention, a 'length direction' refers to an 'L' direction of FIG. 1, a 'width direction' refers to a 'W' direction of FIG. 1, and a 'thickness direction' refers to a 'T' direction of FIG. 1. Here, the 'thickness direction' is the same as a direction in which dielectric layers are stacked, that is, a 'stacking direction'.

The ceramic body 110 may be formed by multi-layering a plurality of dielectric layers 111.

The plurality of dielectric layers 111 configuring the ceramic body 110 may be in a sintered state. Adjacent dielectric layers may be integrated so that boundaries therebetween are not readily apparent.

The dielectric layer 111 may be formed by sintering a ceramic green sheet including ceramic powder.

The ceramic powder may be any material generally used in the art without being particularly limited.

The ceramic powder may include, for example, $BaTiO_3$-based ceramic powder, but is not limited thereto.

The $BaTiO_3$-based ceramic powder may include, for example, $(Ba_{1-x}Ca_x)TiO_3$, $Ba(Ti_{1-y}Ca_y)O_3$, $(Ba_{1-x}Ca_x)(Ti_{1-y}Zr_y)O_3$, or $Ba(Ti_{1-y}Zr_y)O_3$ in which Ca, Zr, or the like, is partially dissolved in $BaTiO_3$, but is not limited thereto.

In addition, the ceramic green sheet may include a transition metal, a rare earth element, magnesium (Mg), aluminum (Al), and the like, in addition to the ceramic powder.

A thickness of the dielectric layer 111 may be appropriately changed depending on a target capacitance of the multilayer ceramic capacitor.

The ceramic body 110 may have the internal electrodes 121 and 122 formed therein, wherein the internal electrodes may include the first and second internal electrodes 121 and 122.

The first and second internal electrodes 121 and 122 may be formed on the ceramic green sheets and be then stacked. The first and second internal electrodes 121 and 122 may be formed by sintering while being disposed within the ceramic body 110, having the dielectric layer interposed therebetween.

The first and second internal electrodes 121 and 122 may have opposite polarities and be disposed to face each other in a direction in which the dielectric layers are stacked.

As shown in FIG. 2A, one ends of the first and second internal electrodes 121 and 122 may be alternately exposed to end surfaces of the ceramic body 110 facing each other in the length direction.

In addition, although not shown, according to the embodiment of the invention, the first and second internal electrodes may have lead portions and be exposed to the same surface of the ceramic body through the lead portions.

Alternatively, the first and second internal electrodes 121 and 122 may have the lead portions, and be exposed to one or more surfaces of the ceramic body through the lead portions.

Thicknesses of the first and second internal electrodes 121 and 122 may be appropriately changed in accordance with a target capacitance of the multilayer ceramic capacitor. When the thickness of the first or second internal electrode is defined as Te, the first or second internal electrode may be designed to satisfy the following equation: $0.1\ \mu m \le Te \le 0.5\ \mu m$.

The thickness of the first or second internal electrode 121 and 122 means an average thickness of the first or second internal electrode disposed between the dielectric layers.

In the case of the multilayer ceramic capacitor according to the embodiment of the invention, on a cross-section of the ceramic body taken in a width-thickness direction thereof, when a distance between the uppermost internal electrode and the lowermost internal electrode measured at centers thereof in a width direction thereof is defined as a and a distance between the uppermost internal electrode and the lowermost internal electrode measured at edges thereof in the width direction thereof is defined as b, $0.953 \le a/b \le 0.996$ may be satisfied, and the capacitance of the multilayer ceramic capacitor may be increased when a/b is within a range of 0.953 to 0.996.

On the cross-section of the ceramic body in the width-thickness direction thereof, first and second internal electrodes disposed above the center of the ceramic body in the thickness direction among the first and second internal electrodes may have a downwardly convex shape, and first and second internal electrodes disposed below the center of the ceramic body in the thickness direction among the first and second internal electrodes may have an upwardly convex shape.

That is, according to the embodiment of the invention, the capacitance of the multilayer ceramic capacitor may be increased by controlling a shape of the internal electrode.

Due to the shape of the internal electrode as described above, the ceramic body of the multilayer ceramic capacitor according to the embodiment of the invention may have edge portions in the width direction thereof thicker than a central portion in the width direction thereof.

The external electrodes may be formed on the outer surfaces of the ceramic body 110, wherein the external electrodes may include the first and second external electrodes 131 and 132. The first and second external electrodes 131 and 132 may be electrically connected to the first and second internal electrodes 121 and 122, respectively.

More specifically, the first external electrode 131 may be electrically connected to a portion of the first internal electrode 121 exposed to one surface of the ceramic body 110, and the second external electrode 132 may be electrically connected to a portion of the second internal electrode 122 exposed to the other surface of the ceramic body 110.

In addition, although not shown, a plurality of external electrodes may be formed to be connected to portions of the first and second internal electrodes exposed to the ceramic body.

The first and second external electrodes 131 and 132 may be formed of a conductive paste including a metal powder.

The metal powder included in the conductive paste is not particularly limited, but may include nickel (Ni), copper (Cu), or an alloy thereof.

Thicknesses of the first and second external electrodes 131 and 132 may be appropriately determined depending on the use thereof, or the like.

Figure 3:
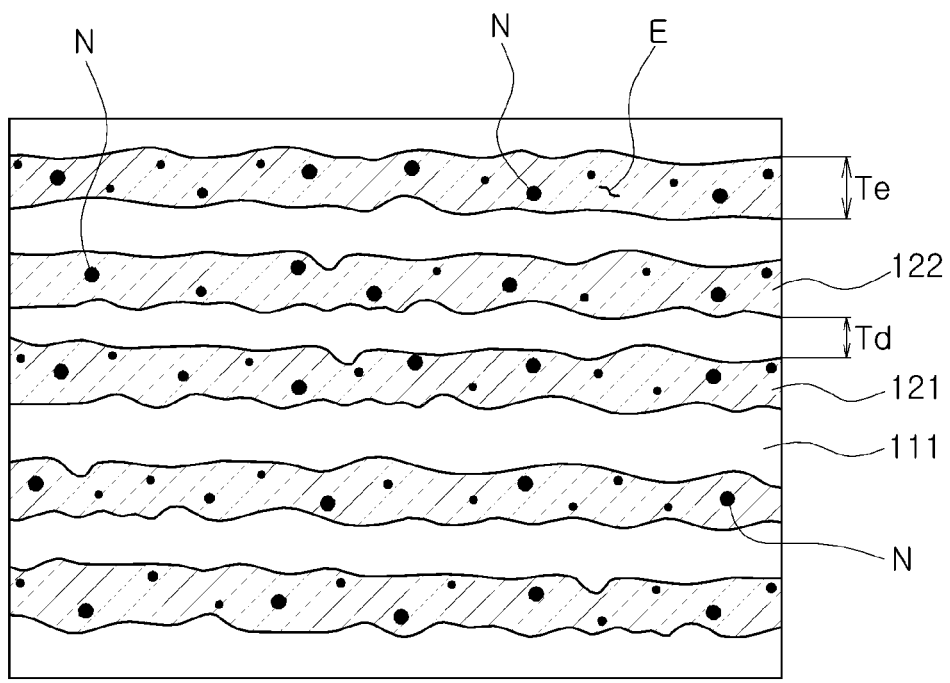
FIG. 3 is a schematic enlarged view illustrating dielectric layers and internal electrodes of the multilayer ceramic capacitor according to the embodiment of the present invention.

FIG. 3 is a schematic enlarged view illustrating dielectric layers and internal electrodes of the multilayer ceramic capacitor according to the embodiment of the present invention.

Referring to FIG. 3, the first and second internal electrodes 121 and 122 of the multilayer ceramic capacitor according to the embodiment of the invention may include non-electrode portions N formed therein. According to the embodiment of the invention, portions of the first and second internal electrodes 121 and 122 except for the non-electrode portions N may be understood to be electrode portions E.

The first and second internal electrodes 121 and 122 may include at least one selected from a group consisting of nickel (Ni), manganese (Mn), chrome (Cr), copper (Cu), palladium (Pd), silver (Ag), cobalt (Co), and aluminum (Al), but is not limited thereto.

That is, the electrode portions E of the first and second internal electrodes may include at least one selected from a group consisting of nickel (Ni), manganese (Mn), chrome (Cr), copper (Cu), palladium (Pd), silver (Ag), cobalt (Co), and aluminum (Al).

According to the embodiment of the invention, the non-electrode portions N may be formed in a process of sintering the first and second internal electrodes, and be formed of a composition included in a conductive paste forming the internal electrodes.

The non-electrode portions N may include a ceramic material. As the ceramic material included in the non-electrode portions, the same material as the ceramic powder forming the dielectric layer 111 may be used. The ceramic material may include at least one of barium titanate and a barium titanate oxide, but is not limited thereto.

That is, the first and second internal electrodes 121 and 122 may include a conductive metal and a ceramic additive, and have the electrode portions E formed of the conductive metal and the non-electrode portions N formed of the ceramic additive, wherein the non-electrode portions N do not contribute to the forming of capacitance.

Further, in the multilayer ceramic capacitor according to the embodiment of the invention, when a thickness of the dielectric layer is defined as Td and a thickness of the first or second internal electrode is defined as Te, $0.5 \le Te/Td \le 1.2$ may be satisfied. The reason why the thicknesses of the internal electrode and the dielectric layer are controlled is to prevent generation of a contraction crack. In the case in which Te/Td exceeds 1.2, the contraction crack may be generated in a sintering process, and in the case in which Te/Td is less than 0.5, it is difficult to implement a target capacitance.

Therefore, Te/Td may be within a range of 0.5 to 1.2.

An average thickness of the first or second internal electrode 121 and 122 may be measured on an image obtained by scanning a cross-section of the ceramic body 110 in a length-thickness (L-T) direction using a scanning electron microscope (SEM).

For example, with respect to any internal electrode extracted from the image obtained by scanning the cross-section of the ceramic body 110 in the length and thickness (L-T) direction cut in a central portion of the ceramic body 110 in the width (W) direction using the scanning electron microscope (SEM), thicknesses of the internal electrode may be measured at thirty equidistant points thereof in the length direction to calculate an average value thereof.

The thicknesses at thirty equidistant points may be measured in a capacitance forming part in which the first and second internal electrodes 121 and 122 are overlapped with each other.

In addition, when an average thickness of ten or more internal electrodes is measured, the average thickness of the internal electrodes may be further generalized.

The thickness of the dielectric layer may be measured by the same method as the above-described method of measuring the thickness of the internal electrode.

Generally, when a ceramic body is sintered, internal electrodes may be expanded. The expansion of the internal electrodes largely occurs in central portions of the internal electrodes, such that the internal electrodes formed in an upper portion of the ceramic body in a thickness direction thereof may have an upwardly convex shape and the internal electrodes formed in a lower portion of the ceramic body in the thickness direction thereof may have a downwardly convex shape. Therefore, a central portion of the ceramic body in the width and length direction may be convexly expanded.

In the case in which the central portions of the internal electrodes are expanded, connectivity of the internal electrodes is decreased, whereby the capacitance of a multilayer ceramic capacitor may be decreased.

However, according to the embodiment of the invention, the expansion of the central portions of the internal electrodes is suppressed and the shape of the internal electrodes is controlled, whereby the capacitance of the multilayer ceramic capacitor may be improved.

Further, according to the embodiment of the invention, the thicknesses of the internal electrodes and the dielectric layers are controlled, whereby a multilayer ceramic capacitor having high reliability may be provided.

Method of Manufacturing Multilayer Ceramic Capacitor

Figure 4:
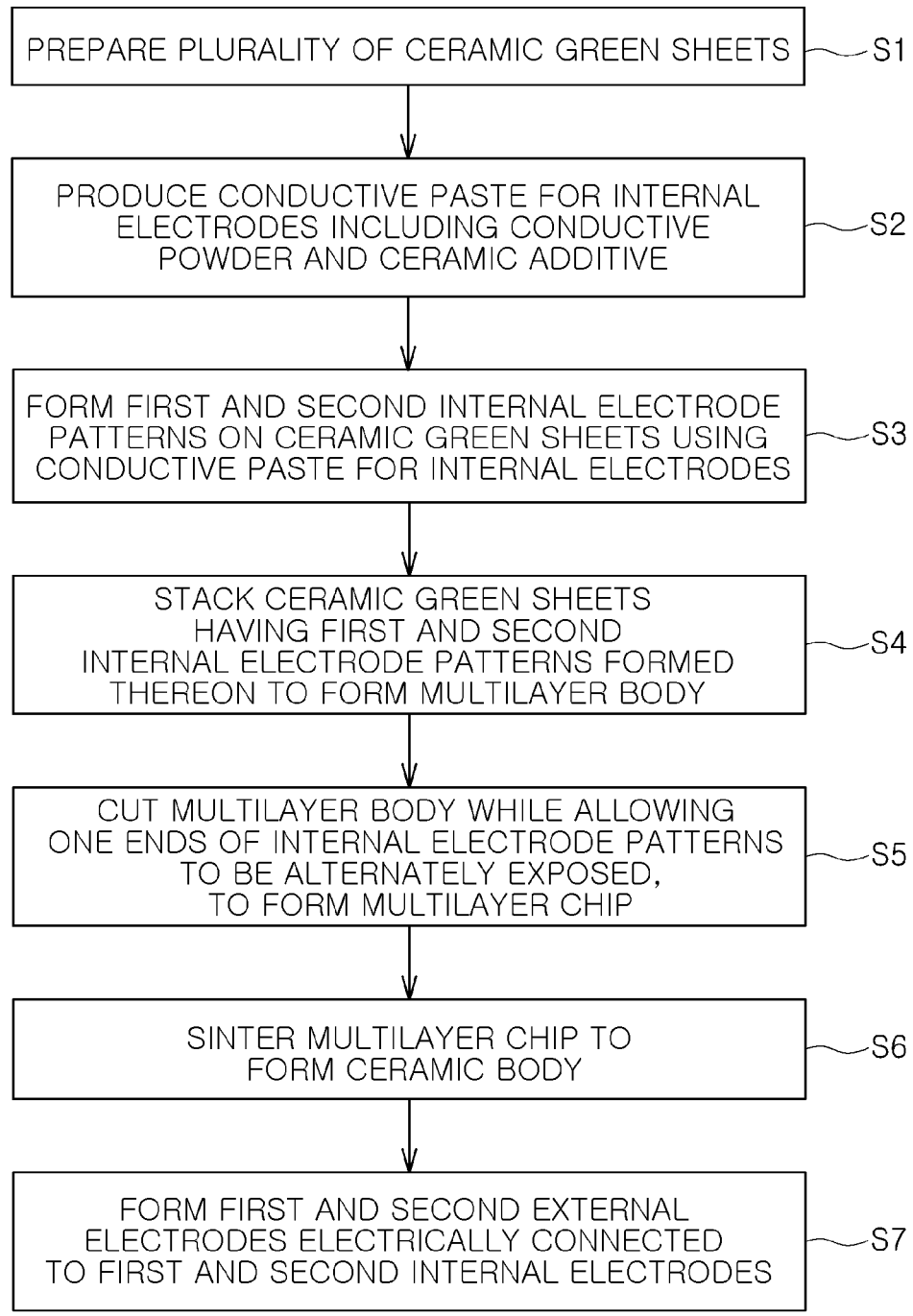
FIG. 4 is a flowchart illustrating a method of manufacturing a multilayer ceramic capacitor according to an embodiment of the present invention.

FIG. 4 is a flowchart illustrating a method of manufacturing a multilayer ceramic capacitor according to another embodiment of the present invention.

Referring to FIG. 4, a method of manufacturing a multilayer ceramic capacitor according to another embodiment of the invention may include preparing a plurality of ceramic green sheets; producing a conductive paste for internal electrodes including a conductive powder and a ceramic additive; forming internal electrode patterns on the ceramic green sheets using the conductive paste for internal electrodes; stacking the ceramic green sheets having the internal electrode patterns formed thereon to form a multilayer body; cutting the multilayer body while allowing one ends of the internal electrode patterns to be alternately exposed, thereby preparing a multilayer chip; sintering the multilayer chip to form a ceramic body including internal electrodes; and forming external electrodes to be electrically connected to the internal electrodes, wherein on a cross-section of the ceramic body in a width-thickness direction thereof, when a distance between the uppermost internal electrode and the lowermost internal electrode measured at centers thereof in a width direction thereof is defined as a and a distance between the uppermost internal electrode and the lowermost internal electrode measured at edged thereof in the width direction thereof is defined as b, $0.953 \leq a/b \leq 0.996$ may be satisfied.

Hereinafter, the method of manufacturing a multilayer ceramic capacitor according to the embodiment of the invention will be described. However, the invention is not limited thereto.

In addition, descriptions of the method of manufacturing a multilayer ceramic capacitor according to the present embodiment overlapped with those of the multilayer ceramic capacitor according to the above-described embodiment will be omitted.

In the method of manufacturing a multilayer ceramic capacitor according to the embodiment of the invention, slurry including a powder such as a barium titanate ($BaTiO_3$) powder, or the like, may be applied to carrier films and dried to prepare a plurality of ceramic green sheets, thereby forming dielectric layers and cover layers.

The ceramic green sheet may be manufactured by mixing a ceramic powder, a binder, and a solvent with each other to prepare the slurry and forming a sheet having a predetermined thickness using the slurry by a doctor blade method.

Next, a conductive paste for internal electrodes including a conductive powder and a ceramic additive may be prepared.

When an average particle size of the conductive powder is defined as d1 and an average particle size of the ceramic additive is defined as d2, in the case in which an average particle size ratio between the conductive powder and the ceramic additive satisfies the following equation: $0.03 \leq d2/d1 \leq 0.05$, the conductive paste for internal electrodes may include 3 to 14 parts by weight of the ceramic additive based on 100 parts by weight of the conductive powder.

When the range of $0.03 \leq d2/d1 \leq 0.05$ is satisfied, in the case in which a content of the ceramic additive is less than 3 parts by weight based on 100 parts by weight of the conductive powder, a/b (a is the distance between the uppermost internal electrode and the lowermost internal electrode measured at the centers thereof in the width direction and b is the distance between the uppermost internal electrode and the lowermost internal electrode measured at the edges thereof in the width direction) measured after sintering exceeds 0.996, such that the shape of the internal electrodes may not be controlled, and in the case in which a content of the ceramic additive exceeds 14 parts by weight based on 100 parts by weight of the conductive powder, a/b measured after sintering also exceeds 0.996, such that the shape of the internal electrodes may not be controlled, resulting in a reduction of capacitance.

In addition, in the case in which the average particle size ratio between the conductive powder and the ceramic additive satisfies the following equation: $0.05 \leq d2/d1 \leq 0.1$, the conductive paste for internal electrodes may include 6 to 12 parts by weight of the ceramic additive based on 100 parts by weight of the conductive powder.

When the range of $0.05 \leq d2/d1 \leq 0.1$ is satisfied, in the case in which a content of the ceramic additive is less than 6 parts by weight based on 100 parts by weight of the conductive powder, a/b (a is the distance between the uppermost internal electrode and the lowermost internal electrode measured at the centers thereof in the width direction and b is the distance between the uppermost internal electrode and the lowermost internal electrode measured at the edges thereof in the width direction) measured after sintering exceeds 0.996, such that the shape of the internal electrodes may not be controlled, and in the case in which a content of the ceramic additive exceeds 12 parts by weight based on 100 parts by weight of the conductive powder, a/b measured after sintering also exceeds 0.996, such that the shape of the internal electrodes may not be controlled, resulting in a reduction of capacitance.

The conductive powder may include at least one selected from a group consisting of nickel (Ni), manganese (Mn), chrome (Cr), copper (Cu), palladium (Pd), silver (Ag), cobalt (Co), and aluminum (Al), but is not limited thereto.

As the ceramic additive, the same material as the dielectric material included in the ceramic green sheet may be used. The ceramic additive may include at least one of barium titanate and a barium titanate oxide, but is not limited thereto.

Next, the conductive paste for internal electrodes may be applied to the ceramic green sheets by a screen printing method to form internal electrodes. A plurality of ceramic green sheets having the internal electrode patterns printed thereon may be stacked to form a multilayer body, and a plurality of ceramic green sheets having no internal electrode pattern may be stacked on upper and lower surfaces of the multilayer body. Then, the multilayer body may be cut such that one ends of the internal electrode patterns are alternately exposed, thereby preparing a multilayer chip.

Then, the multilayer chip may be sintered to manufacture the ceramic body 110.

The sintering of the multilayer chip may include maintaining the multilayer chip for a predetermined time in two or more temperature sections during the sintering.

That is, the sintering of the multilayer chip may include maintaining the multilayer chip for a predetermined time in a first temperature section and then maintaining the multilayer chip for a predetermined time in a second temperature section.

The time for which the multilayer chip is maintained in the first temperature section may be 120 to 180 minutes, and the time for which the multilayer chip is maintained in the second temperature section may be 150 to 300 minutes.

When a sintering temperature of the internal electrode pattern is defined as P, the first temperature section may be −30° C. to P+20° C., when a sintering temperature of the ceramic green sheet is defined as Q, the second temperature section may be Q−50° C. to Q+5° C.

That is, according to the embodiment of the invention, even when the multilayer chip and the internal electrodes are sintered together, an average particle size and a content of the ceramic additive included in the conductive paste for internal electrodes are controlled, whereby expansion of the internal electrodes may be prevented.

Further, in the first temperature section, the internal electrode patterns are sintered; however, the ceramic green sheets are not sintered, such that the ceramic green sheets that are not sintered may prevent shrinkage of the internal electrodes. Therefore, the expansion of the internal electrodes in the thickness direction may be controlled and the shape of the internal electrodes may be optimized by a composition of the conductive paste for internal electrodes.

The ceramic body may include the internal electrodes 121 and 122, the dielectric layers 111, and the cover layers. Here, the dielectric layers may be formed by sintering the ceramic green sheets on which the internal electrode patterns are printed, and the cover layers may be formed by sintering the ceramic green sheets on which the internal electrode patterns are not printed.

Due to the shape of the internal electrodes as described above, edge portions of the ceramic body in the width direction thereof may be thicker than a central portion thereof in the width direction thereof.

The internal electrodes may include the first and second internal electrodes 131 and 132.

The first and second external electrodes 131 and 132 may be formed on outer surfaces of the ceramic body so as to be electrically connected to the first and second internal electrodes, respectively. The first and second external electrodes may be formed by sintering a paste including a conductive metal and glass.

The conductive metal is not particularly limited, but may be, for example, at least one selected from a group consisting of copper (Cu), silver (Ag), nickel (Ni), and alloys thereof.

The glass is not particularly limited, but may be a material having the same composition as that of glass used to manufacture external electrodes of a general multilayer ceramic capacitor.

Further, the first and second external electrodes 131 and 132 may further include conductive resin layers (not shown) formed by applying a conductive resin composition including a conductive powder to outer surfaces of the first and second external electrodes 131 and 132 and then curing the conductive resin composition. The conductive resin composition may include the conductive powder and a base resin, wherein the base resin may be an epoxy resin, which is a thermosetting resin.

The method of manufacturing a multilayer ceramic capacitor according to the embodiment of the invention may further include forming a nickel plating layer and a tinplating layer after the forming of the conductive resin layers.

Board Having Multilayer Ceramic Capacitor Mounted Thereon

Figure 5:
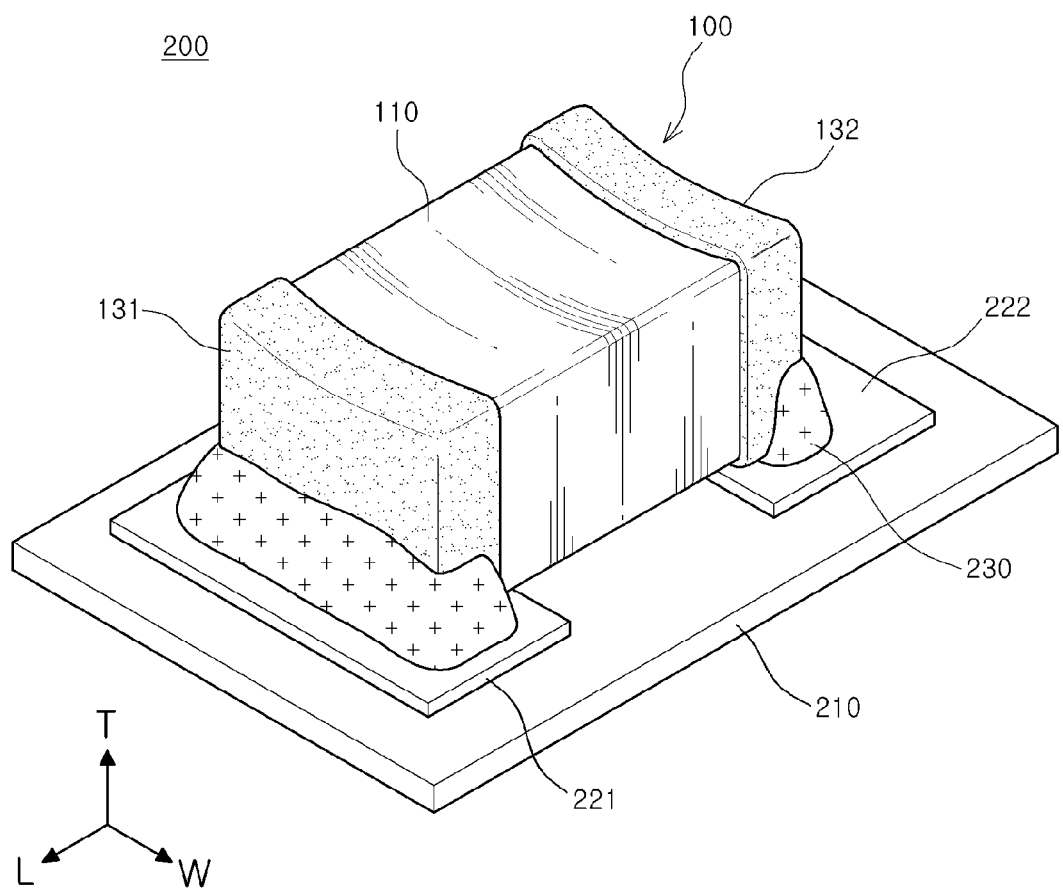
FIG. 5 is a schematic perspective view illustrating a board having the multilayer ceramic capacitor mounted thereon according to an embodiment of the present invention mounted thereon.

FIG. 5 is a schematic perspective view illustrating a board having a multilayer ceramic capacitor mounted thereon according to another embodiment of the present invention.

Referring to FIG. 5, a board 200 having a multilayer ceramic capacitor mounted thereon according to the present embodiment may include a printed circuit board 210 having first and second electrode pads 221 and 222 disposed thereon; and a multilayer ceramic capacitor 100 mounted on the printed circuit board 210, wherein the multilayer ceramic capacitor includes a ceramic body including dielectric layers and a plurality of internal electrodes disposed in the ceramic body, having the dielectric layer interposed therebetween, and on a cross-section of the ceramic body in a width-thickness direction, when a distance between the uppermost internal electrode and the lowermost internal electrode measured at centers thereof in a width direction thereof is defined as a and a distance between the uppermost internal electrode and the lowermost internal electrode measured at edges thereof in the width direction thereof is defined as b, $0.953 \leq a/b \leq 0.996$ is satisfied.

Since the multilayer ceramic capacitor 100 mounted on the printed circuit board 210 according to the present embodiment is the same as the multilayer ceramic capacitor described above, a description thereof will be omitted.

Experimental Examples

The following Table 1 shows evaluation results of an average particle size ratio (d2/d1 when an average particle size of a conductive powder is defined as d1 and an average particle size of a ceramic additive is defined as d2) between the conductive powder and the ceramic additive included in a conductive paste for internal electrodes, a content of the ceramic additive based on 100 parts by weight of the conductive powder, the shape of internal electrodes formed of the conductive paste (a/b when a distance between the uppermost internal electrode and the lowermost internal electrode measured at centers thereof in a width direction thereof is defined as a and a distance between the uppermost internal electrode and the lowermost internal electrode measured at edges thereof in the width direction thereof is defined as b), and whether or not a target capacitance has been implemented.

The multilayer ceramic capacitors according to the Experimental Examples were manufactured as follows.

First, slurry including a powder such as a barium titanate ($BaTiO_3$) powder, or the like, having an average particle size of 0.05 μm to 0.2 μm was applied to carrier films and dried to prepare a plurality of ceramic green sheets, thereby forming dielectric layers.

Next, a nickel powder and a ceramic powder were provided as a conductive powder and a ceramic additive, respectively, while satisfying average particle size ratios shown in the following Table 1, and were mixed with each other while satisfying content ranges shown in the following Table 1, thereby allowing conductive pastes for internal electrodes to be formed.

Then, the conductive pastes for internal electrodes were applied to the ceramic green sheets by a screen printing method to form internal electrodes, and three hundred ceramic green sheets were stacked to form respective multilayer bodies.

Then, the multilayer bodies were compressed and cut to form respective chips having a 0603 standard size, and the chips were sintered at a temperature of 1050° C. to 1200° C. under a reducing atmosphere in which $H_2$ was 0.1% or less.

Next, processes such as an external electrode forming process, a plating process, and the like, were performed to manufacture multilayer ceramic capacitors. Electrical characteristics of the individual multilayer ceramic capacitors were evaluated. In the case in which capacitance values of the manufactured chips are decreased by 15% or more as a result of measuring the capacitance thereof (for example, in the case in which a capacitance value is 3.995 µF or less when a target capacitance is 4.7 µF), it is determined that the target capacitance has not been implemented.

In experimental data of Table 1, the internal electrodes and the dielectric layers were manufactured to satisfy a thickness ratio of 1:1.

TABLE 1

| Sample | d2/d1 | Content (parts by weight) of Ceramic Additive Based on 100 Parts by Weight of Conductive Powder | a/b | Implementation of Target Capacitance | Occurrence of Cracking |
|---|---|---|---|---|---|
| 1* | 0.02~0.03 | 1 | 0.998 | x | x |
| 2 | 0.02~0.03 | 2 | 0.983 | o | x |
| 3 | 0.02~0.03 | 3 | 0.961 | o | x |
| 4* | 0.02~0.03 | 4 | 0.949 | o | o |
| 5* | 0.02~0.03 | 6 | 0.945 | o | o |
| 6* | 0.02~0.03 | 8 | 0.941 | o | o |
| 7* | 0.02~0.03 | 10 | 0.939 | o | o |
| 8* | 0.02~0.03 | 12 | 0.948 | o | o |
| 9 | 0.02~0.03 | 14 | 0.960 | o | x |
| 10 | 0.02~0.03 | 20 | 0.981 | o | x |
| 11* | 0.03~0.05 | 1 | 1.047 | x | x |
| 12* | 0.03~0.05 | 2 | 1.022 | x | x |
| 13 | 0.03~0.05 | 3 | 0.992 | o | x |
| 14 | 0.03~0.05 | 6 | 0.953 | o | x |
| 15 | 0.03~0.05 | 8 | 0.968 | o | x |
| 16 | 0.03~0.05 | 10 | 0.971 | o | x |
| 17 | 0.03~0.05 | 12 | 0.976 | o | x |
| 18 | 0.03~0.05 | 14 | 0.991 | o | x |
| 19* | 0.03~0.05 | 16 | 0.998 | x | x |
| 20* | 0.03~0.05 | 20 | 1.016 | x | x |
| 21* | 0.05~0.1 | 1 | 1.117 | x | x |
| 22* | 0.05~0.1 | 2 | 1.068 | x | x |
| 23* | 0.05~0.1 | 3 | 1.021 | x | x |
| 24* | 0.05~0.1 | 4 | 1.005 | x | x |
| 25 | 0.05~0.1 | 6 | 0.981 | o | x |
| 26 | 0.05~0.1 | 8 | 0.987 | o | x |
| 27 | 0.05~0.1 | 10 | 0.991 | o | x |
| 28 | 0.05~0.1 | 12 | 0.996 | o | x |
| 29* | 0.05~0.1 | 14 | 1.008 | x | x |
| 30* | 0.05~0.1 | 20 | 1.024 | x | x |
| 31* | 0.1~0.2 | 1 | 1.098 | x | x |
| 32* | 0.1~0.2 | 2 | 1.091 | x | x |
| 33* | 0.1~0.2 | 3 | 1.078 | x | x |
| 34* | 0.1~0.2 | 4 | 1.069 | x | x |
| 35* | 0.1~0.2 | 6 | 1.061 | x | x |
| 36* | 0.1~0.2 | 8 | 1.055 | x | x |
| 37* | 0.1~0.2 | 10 | 1.046 | x | x |
| 38* | 0.1~0.2 | 12 | 1.057 | x | x |
| 39* | 0.1~0.2 | 14 | 1.061 | x | x |
| 40* | 0.1~0.2 | 20 | 1.069 | x | x |

*Comparative Example
o: Capacitance is 85% or more as compared with target capacitance
x: Capacitance is less than 85% as compared with target capacitance
o: Cracking occurred after sintering
x: No cracking occurred after sintering Referring to Table 1, in Sample 1 in which a/b exceeded 0.996, a target capacitance was not implemented, and in Samples 2 and 3 in which a/b was 0.953 to 0.996, a target capacitance was implemented and cracking did not occur. However, in Samples 4 and 8 in which a/b was less than 0.953, a target capacitance was implemented, but cracking occurred in the sintering process.

Next, in Samples 11 to 40 in which a/b was 0.953 or greater, cracking did not occur. However, in Samples 11, 12, 19 to 24, and 29 to 40 in which a/b exceeded 0.996, a target capacitance was not implemented.

Therefore, it may be appreciated that a/b may be in the range of 0.953 to 0.996 in order to prevent the occurrence of cracking while implementing the target capacitance. In the case in which a/b satisfies the above-mentioned numerical range, the target capacitance after sintering has been implemented and cracking has not occurred, whereby a multilayer ceramic capacitor may achieve excellent reliability and have high capacitance implemented therein.

The following Table 2 shows whether or not cracking has occurred and whether or not a target capacitance has been implemented depending on a ratio (Te/Td) between a thickness (Te) of an internal electrode and a thickness (Td) of a dielectric layer in each multilayer ceramic capacitor obtained by the above-described manufacturing method.

TABLE 2

| Sample | Te/Td | Implementation of Target Capacitance | Occurrence of Cracking |
|---|---|---|---|
| 41* | 0.3 | x | x |
| 42* | 0.4 | x | x |
| 43 | 0.5 | o | x |
| 44 | 0.8 | o | x |
| 45 | 1.2 | o | x |
| 46* | 1.5 | o | o |
| 47* | 2.0 | o | o |
| 48* | 2.5 | o | o |

*Comparative Example
o: Capacitance is 90% or more as compared with target capacitance
x: Capacitance is less than 90% as compared with target capacitance
o: Cracking occurred after sintering
x: No cracking occurred after sintering Referring to Table 2, in Samples 41 and 42 (Comparative Examples) in which Te/Td was less than 0.5, a target capacitance was not implemented, and in Samples 46 to 48

(Comparative Examples) in which Te/Td exceeded 1.2, cracking occurred after sintering, such that reliability was problematic.

In Samples 43 to 45 (Inventive Examples) in which a numerical range according to the inventive concept was satisfied, cracking did not occur and a target capacitance was implemented. It may be appreciated that a multilayer ceramic capacitor satisfying the numerical range according to the inventive concept may achieve excellent reliability and have high capacitance implemented therein.

As set forth above, according to embodiments of the invention, a multilayer ceramic capacitor having high capacitance and high reliability, a method of manufacturing the same, and a board having the same mounted thereon may be provided.

While the present invention has been shown and described in connection with the embodiments, it will be apparent to those skilled in the art that modifications and variations can be made without departing from the spirit and scope of the invention as defined by the appended claims.

What is claimed is:

1. A multilayer ceramic capacitor comprising:
    a ceramic body including dielectric layers, the ceramic body being capable of mounting a printed circuit board and comprising a mounting surface being able to face the printed circuit board; and
    a plurality of internal electrodes disposed within the ceramic body, having at least one the dielectric layers interposed therebetween, stacked along a thickness direction, and being parallel with respect to the mounting surface,
    wherein an uppermost internal electrode is in the highest position and a lowermost internal electrode is in the lowest position, with respect to the thickness direction among a plurality of internal electrodes being parallel to the mounting surface, and
    wherein, on a cross section of the ceramic body in a width-thickness direction thereof, when a distance between the uppermost internal electrode and the lowermost internal electrode measured at centers thereof in a width direction thereof is defined as a and a distance between the uppermost internal electrode and the lowermost internal electrode measured at edges thereof in the width direction thereof is defined as b, $0.953 \leq a/b \leq 0.996$ is satisfied.

2. The multilayer ceramic capacitor of claim 1, wherein edge portions of the ceramic body in a width direction thereof are thicker than a central portion thereof in the width direction.

3. The multilayer ceramic capacitor of claim 1, wherein the internal electrodes include non-electrode portions.

4. The multilayer ceramic capacitor of claim 1, wherein the internal electrodes include at least one selected from a group consisting of nickel (Ni), manganese (Mn), chrome (Cr), copper (Cu), palladium (Pd), silver (Ag), cobalt (Co), and aluminum (Al).

5. The multilayer ceramic capacitor of claim 3, wherein the non-electrode portions include a ceramic material.

6. The multi layer ceramic capacitor of claim 3, wherein the non-electrode portions include at least one of barium titanate and a barium titanate oxide.

7. The multilayer ceramic capacitor of claim 1, wherein the internal electrodes have a thickness of 0.1 µm to 0.5 µm.

8. A method of manufacturing a multilayer ceramic capacitor, the method comprising:
    preparing a plurality of ceramic green sheets;
    producing a conductive paste for internal electrodes including a conductive powder and a ceramic additive;
    forming internal electrode patterns on the ceramic green sheets using the conductive paste for internal electrodes;
    stacking the ceramic green sheets having the internal electrode patterns formed thereon to form a multilayer body;
    cutting the multilayer body while allowing one ends of the internal electrode patterns to be alternately exposed, to form a multilayer chip;
    sintering the multilayer chip to form a ceramic body including internal electrodes; and
    forming external electrodes so as to be electrically connected to the internal electrodes,
    wherein, on a cross section of the ceramic body in a width-thickness direction thereof, when a distance between an uppermost internal electrode and a lowermost internal electrode measured at centers thereof in a width direction thereof is defined as a and a distance between the uppermost internal electrode and the lowermost internal electrode measured at edges thereof in the width direction thereof is defined as b, $0.953 \leq a/b \leq 0.996$ is satisfied.

9. The method of claim 8, wherein the multilayer chip is sintered while maintaining the multilayer chip for a predetermined time in two or more temperature sections.

10. The method of claim 8, wherein a content of the ceramic additive is 3 to 14 parts by weight based on 100 parts by weight of the conductive powder.

11. The method of claim 10, wherein when an average particle size of the conductive powder is defined as d1 and an average particle size of the ceramic additive is defined as d2, $0.03 \leq d2/d1 \leq 0.05$ is satisfied.

12. The method of claim 8, wherein a content of the ceramic additive is 6 to 12 parts by weight based on 100 parts by weight of the conductive powder.

13. The method of claim 12, wherein when an average particle size of the conductive powder is defined as d1 and an average particle size of the ceramic additive is defined as d2, $0.05 \leq d2/d1 \leq 0.1$ is satisfied.

14. The method of claim 8, wherein the conductive powder includes at least one selected from a group consisting of nickel (Ni), manganese (Mn), chrome (Cr), copper (Cu), palladium (Pd), silver (Ag), cobalt (Co), and aluminum (Al).

15. The method of claim 8, wherein the ceramic additive includes at least one of barium titanate and a barium titanate oxide.

16. The method of claim 8, wherein edge portions of the ceramic body in a width direction thereof are thicker than a central portion thereof in the width direction.

17. A board having a multilayer ceramic capacitor mounted thereon, the board comprising:
    a printed circuit board having first and second electrode pads disposed thereon; and
    a multilayer ceramic capacitor mounted on the printed circuit board,
        wherein the multilayer ceramic capacitor includes:
        a ceramic body including dielectric layers, the ceramic body being capable of mounting the printed circuit board and comprising a mounting surface being able to face the printed circuit board; and
        a plurality of internal electrodes disposed within the ceramic body, having at least one the dielectric layers interposed therebetween, stacked along a thickness direction, and being parallel with respect to the mounting surface, wherein an uppermost internal electrode is in the highest position and a lowermost internal electrode is in the lowest position, with respect to the thickness direction among a plurality of internal electrodes being parallel to the mounting surface, and wherein, on a cross section of the ceramic body in a width-thickness direction thereof, when a distance between the uppermost internal electrode and the lowermost internal electrode measured at centers thereof in a width direction thereof is defined as a and a distance between the uppermost internal electrode and the lowermost internal electrode measured at edges thereof in the width direction thereof is defined as b, $0.953 \leq a/b \leq 0.996$ is satisfied.

* * * * *